United States Patent
Streitel et al.

(10) Patent No.: US 9,722,159 B2
(45) Date of Patent: Aug. 1, 2017

(54) OPTOELECTRONIC COMPONENT WITH A PRE-ORIENTED MOLECULE CONFIGURATION AND METHOD FOR PRODUCING AN OPTOELECTRONIC COMPONENT WITH A PRE-ORIENTED MOLECULE CONFIGURATION

(71) Applicant: OSRAM Opto Semiconductors GmbH, Regensburg (DE)

(72) Inventors: Reinhard Streitel, Laaber (DE); Kathy Schmidtke, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/430,735

(22) PCT Filed: Sep. 6, 2013

(86) PCT No.: PCT/EP2013/068483
§ 371 (c)(1),
(2) Date: Mar. 24, 2015

(87) PCT Pub. No.: WO2014/044557
PCT Pub. Date: Mar. 27, 2014

(65) Prior Publication Data
US 2015/0228874 A1 Aug. 13, 2015

(30) Foreign Application Priority Data

Sep. 24, 2012 (DE) .................. 10 2012 108 995
Feb. 15, 2013 (DE) .................. 10 2013 101 529

(51) Int. Cl.
*H01L 33/00* (2010.01)
*H01L 23/02* (2006.01)
(Continued)

(52) U.S. Cl.
CPC .......... *H01L 33/62* (2013.01); *H01L 23/3737* (2013.01); *H01L 24/27* (2013.01);
(Continued)

(58) Field of Classification Search
CPC ......... H01L 33/62; H01L 24/29; H01L 33/64; H01L 2224/83192; H01L 2224/2784;
(Continued)

(56) References Cited

U.S. PATENT DOCUMENTS 5,150,236 A * 9/1992 Patel ................. G02F 1/216
349/114
5,296,074 A * 3/1994 Graham ............ H01L 23/49513
156/309.9
(Continued)

FOREIGN PATENT DOCUMENTS

| CN | 101987896 A | 3/2011 |
|---|---|---|
| CN | 102067248 A | 5/2011 |

(Continued)

OTHER PUBLICATIONS

Fakirov, S., "Oriented Polymer Materials," WILEY-VCH Verlag GmbH & Co. KGaA, May 28, 2008, Chapters 1, 2, 4, 6, 10-12, 14, pp. 1-98, 138-166, 184-209, 302-393, 422-443.
(Continued)

*Primary Examiner* — Benjamin Sandvik
*Assistant Examiner* — Damon Hillman
(74) *Attorney, Agent, or Firm* — Slater Matsil, LLP

(57) ABSTRACT

An optoelectronic component includes a substrate, a connecting element applied on the substrate and a layer sequence that emits electromagnetic radiation. The layer sequence is applied on the connecting element. The connecting element includes at least one connecting material that has an oriented molecular configuration. The connecting element has at least one parameter that is anisotropic.

19 Claims, 7 Drawing Sheets

(51) Int. Cl.
*H01L 33/62* (2010.01)
*H01L 23/373* (2006.01)
*H01L 33/64* (2010.01)
*H01L 23/00* (2006.01)

(52) U.S. Cl.
CPC ............ *H01L 24/29* (2013.01); *H01L 24/743* (2013.01); *H01L 24/83* (2013.01); *H01L 33/64* (2013.01); *H01L 24/32* (2013.01); *H01L 24/48* (2013.01); *H01L 24/73* (2013.01); *H01L 2224/278* (2013.01); *H01L 2224/2783* (2013.01); *H01L 2224/2784* (2013.01); *H01L 2224/27848* (2013.01); *H01L 2224/2919* (2013.01); *H01L 2224/2939* (2013.01); *H01L 2224/29193* (2013.01); *H01L 2224/32013* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2224/83101* (2013.01); *H01L 2224/83192* (2013.01); *H01L 2224/92247* (2013.01); *H01L 2924/00014* (2013.01); *H01L 2924/12036* (2013.01); *H01L 2924/12041* (2013.01); *H01L 2924/12042* (2013.01); *H01L 2924/12044* (2013.01); *H01L 2924/15787* (2013.01); *H01L 2924/181* (2013.01)

(58) Field of Classification Search
CPC ....... H01L 2224/32013; H01L 23/3737; H01L 24/73; H01L 24/32; H01L 2224/32245; H01L 24/48
See application file for complete search history.

(56) References Cited

U.S. PATENT DOCUMENTS

| | | | | |
|---|---|---|---|---|
| 6,517,744 | B1* | 2/2003 | Hara | .................... B29C 70/025 148/108 |
| 2002/0084536 | A1* | 7/2002 | Sundahl | ............... H05K 3/4614 257/784 |
| 2004/0251478 | A1 | 12/2004 | Dahl et al. | |
| 2006/0153981 | A1 | 7/2006 | Husemann et al. | |
| 2009/0026484 | A1* | 1/2009 | Hsu | ....................... H01L 33/641 257/99 |
| 2012/0074430 | A1 | 3/2012 | Lee et al. | |
| 2012/0168206 | A1 | 7/2012 | Sekine et al. | |
| 2012/0249375 | A1* | 10/2012 | Heino | ....................... C08J 3/24 343/700 MS |
| 2013/0045347 | A1* | 2/2013 | Kawasumi | .............. B29C 55/06 428/35.2 |
| 2016/0141085 | A1 | 5/2016 | Heino et al. | |

FOREIGN PATENT DOCUMENTS

| | | | | |
|---|---|---|---|---|
| CN | 102602076 A | | 7/2012 | |
| DE | 10259451 A1 | | 7/2004 | |
| JP | 200181418 A | | 3/2001 | |
| JP | 2001214075 A | | 8/2001 | |
| JP | 200933081 A | | 2/2009 | |
| JP | WO 2011135860 A1 | * | 11/2011 | ............. B29C 55/06 |
| JP | 2012109312 A | | 6/2012 | |
| WO | 2011135860 A1 | | 11/2011 | |

OTHER PUBLICATIONS

Ward, I.M., "Developments in Oriented Polymers—1," Elsevier Science & Technology, vol. 1, Jul. 1982, Chapters 1, 3, 5, pp. 1-46, 79-120, 153-200.

Ward, I.M., "Developments in Oriented Polymers—2," Elsevier Applied Science, vol. 2, Mar. 31, 1987, Chapters 1, 2, 6, 7, pp. 1-77, 199-268.

Pietralla, M., "High thermal conductivity of polymers: Possibility or dream?," Journal of Computer-Aided Materials Design, vol. 3, Aug. 1996, pp. 273-280.

Ohara, T., et al., Heat Conduction in Chain Polymer Liquids: Molecular Dynamics Study in the Contributions of Inter- and Intramolecular Energy Transfer, AIP The Journal of Chemical Physics, vol. 135, Issue 3, Jul. 21, 2011, pp. 1-4.

* cited by examiner

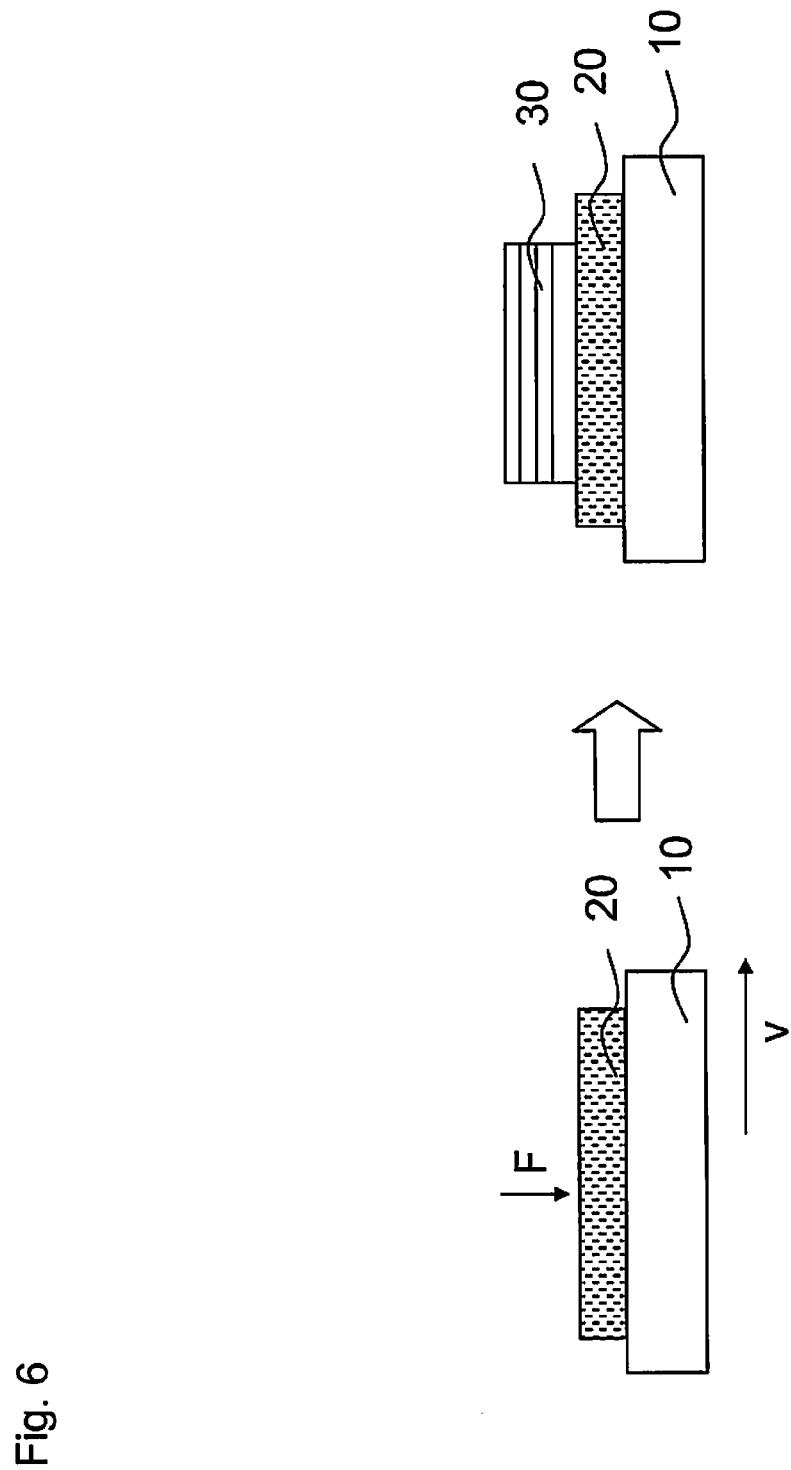

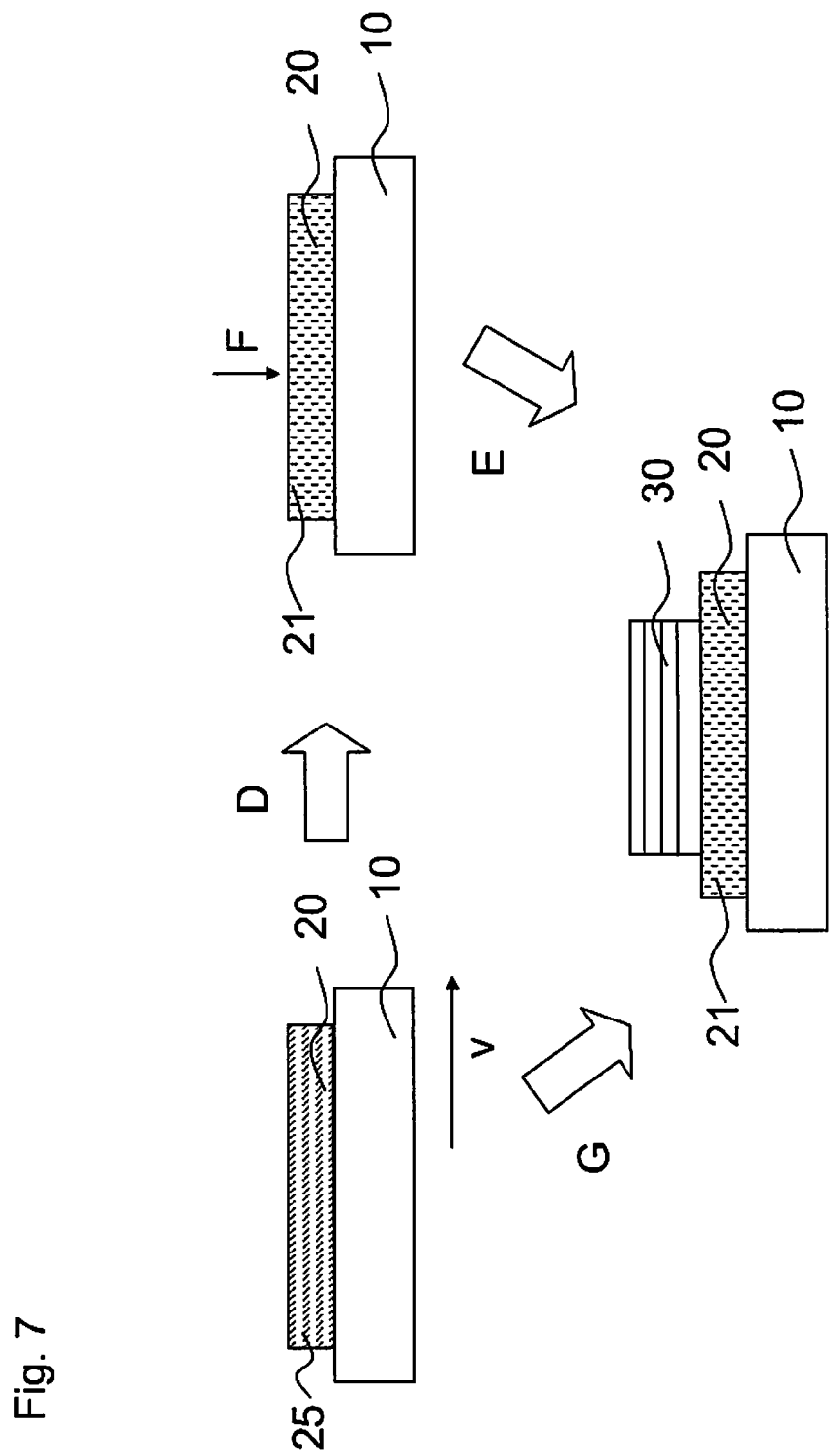

OPTOELECTRONIC COMPONENT WITH A PRE-ORIENTED MOLECULE CONFIGURATION AND METHOD FOR PRODUCING AN OPTOELECTRONIC COMPONENT WITH A PRE-ORIENTED MOLECULE CONFIGURATION

This patent application is a national phase filing under section 371 of PCT/EP2013/068483, filed Sep. 6, 2013, which claims the priority of German patent application 10 2012 108 995.7, filed Sep. 24, 2012, and German patent application 10 2013 101 529.8, filed Feb. 15, 2013, each of which is incorporated herein by reference in its entirety.

TECHNICAL FIELD

The present invention relates to an optoelectronic component and to a method for producing an optoelectronic component.

BACKGROUND

Optoelectronic components, for example, light-emitting diodes (LEDs), often comprise a connecting element which connects the substrate and the radiation-emitting layer sequence to one another. This connecting element generally has a very low thermal conductivity. There is therefore often the problem that the heat generated during operation of an optoelectronic component, for example, the heat generated in the layer sequence, cannot be adequately carried away. In order to increase the thermal conductivity, a filler is mixed into a conventional connecting element, for example. The thermal conductivity can thereby be increased to at most 0.2 to 0.4 W/mk, depending on the degree of filling of 0.01. A disadvantage of this mixed-in filler consists in the fact that the latter can be mixed in only in the form of small particles, in order to obtain the transparency of the connecting element. It is therefore not possible for a thermal conductivity of more than 0.4 W/mK to be produced.

SUMMARY

Embodiments provide an optoelectronic component and also a method for producing an optoelectronic component which have an improved thermal conductivity.

An optoelectronic component comprises a substrate, a connecting element, which is applied on the substrate, and a layer sequence, which emits electromagnetic radiation. In this case, the layer sequence is applied on the connecting element, wherein the connecting element comprises at least one connecting material, wherein the connecting material has an oriented molecule configuration, and wherein the connecting element has at least one parameter which is anisotropic.

It should be pointed out at this point that the term "component" here is to be understood as meaning not only finished components, for example, light-emitting diodes (LEDs) or laser diodes, but also substrates and/or semiconductor layers, and therefore, for example, a composite of a copper layer and of a semiconductor layer can already constitute a component and can form a component part of a superordinate second component, in which electrical connections are additionally present, for example. The optoelectronic component according to the invention can comprise a thin film semiconductor chip, in particular a thin film light-emitting diode chip, for example.

In this context, "layer sequence" is to be understood as meaning a layer sequence comprising more than one layer, for example, a sequence of a p-doped and an n-doped semiconductor layer, with the layers being arranged one underneath another. A semiconductor chip can also be understood to be a layer sequence.

Here and hereinbelow, "electromagnetic radiation", in particular electromagnetic radiation having one or more wavelengths or wavelength ranges from an ultraviolet to infrared spectral range, is also referred to as light. In particular, light can be visible light and comprise wavelengths or wavelength ranges from a visible spectral range of between approximately 350 nm and approximately 800 nm. Here and hereinbelow, visible light can be characterizable, for example, by its color locus having cx and cy color locus coordinates in accordance with the so-called CIE-1931 color locus diagram or CIE standard chromaticity diagram, known to a person skilled in the art.

Here and hereinbelow, the fact that a layer or an element is arranged or applied "on" or "above" another layer or another element can mean here that one layer or one element is arranged directly in direct mechanical and/or electrical contact on the other layer or the other element. Furthermore, it can also mean that one layer or one element is arranged indirectly on or above the other layer or the other element. In this respect, it is then possible for further layers and/or elements to be arranged between one and/or the other layer and, respectively, between one and the other element.

In particular, the fact that "a connecting element is applied on the substrate" means that the connecting element is arranged directly or indirectly in direct mechanical and/or electrical contact on the substrate. In the case of indirect contact, a contact-connecting layer may be present between the connecting element and the substrate, for example.

In particular, the fact that "a layer sequence is applied on the connecting element" means that the layer sequence is arranged indirectly in direct mechanical and/or electrical contact on the connecting element. In this case, it is then possible for further layers and/or elements, for example, a solder layer and/or solder element or a sapphire layer or sapphire element, to be arranged between the connecting element and the layer sequence.

In this context, "connecting element" means that the latter can connect an element and/or layer, for example, the substrate, to another element and/or layer, for example, a semiconductor chip comprising a layer sequence. The connection can be made by physical and/or chemical interactions between the connecting element and the element and/or layer and between the connecting element and the other element and/or layer. Chemical interactions can be intermolecular forces, intramolecular forces and/or chemical bonds, for example, ionic interaction, hydrogen bridges, dipole interaction, Van der Waals interaction, an ionic bond, a covalent bond, a coordinate bond and/or a metallic bond. This makes it possible to achieve better fixing of the substrate and the layer sequence.

According to one embodiment, the connecting element comprises a connecting material, which has an oriented molecule configuration. Here and hereinbelow, "oriented molecule configuration" is to be understood as meaning that an individual molecule or individual molecules of the connecting material can have a spatial orientation in relation to the surface of the substrate which faces toward the connecting element, and/or individual molecules of the connecting material can have a spatial orientation in relation to one another.

According to a further embodiment, the individual molecules of the connecting material are arranged predominantly parallel to one another among one another. In this context, "predominantly" means that the majority of the molecules can be oriented parallel to one another, that is to say that at least 50%, preferably more than 80%, particularly preferably more than 90%, for example, 95%, of the individual molecules of the connecting material can have such an orientation. The connecting material and/or the molecules of the connecting material can have regions which have a different orientation in relation to an x,y plane but have the same orientation in the z direction.

According to a further embodiment, the individual molecules of the connecting material can be arranged perpendicular and/or parallel to the surface of the substrate which faces toward the connecting element. In particular, the individual molecules of the connecting material have a predominantly perpendicular orientation in relation to the surface of the substrate. A molecule configuration with a predominantly parallel and/or perpendicular orientation does not rule out the fact that there may be a slight deviation from the parallel and/or perpendicular orientation in relation to the surface of the substrate.

According to one embodiment, the geometry of the molecules of the connecting material can be chosen as desired. The molecules have an anisotropic shape, for example. In this context, shape anisotropy means that the molecules of the connecting material have a different geometric shape or are shaped irregularly, depending on direction. By way of example, shape anisotropy means that the height, width and depth of the molecule of the connecting material are different. In particular, the molecule of the connecting material is configured in the form of a tube, a rod or a wire, for example, a nanowire. The connecting material can be present in particle form. The size of the particles lies in the nanometer range, for example. The shape anisotropy can improve the anisotropic parameters, for example, increase the thermal conductivity of the connecting element in the direction of the surface of the substrate.

The inventors have discovered that the connecting element according to the invention, which connects at least the substrate and the layer sequence to one another, has an improved direction-dependent thermal conductivity in an optoelectronic component. The higher and/or anisotropic thermal conductivity of the connecting element allows for a better removal of heat from the layer sequence. As a result, the layer sequence can be energized to a greater extent. This results in a higher efficiency of the optoelectronic component. The higher thermal conductivity of the connecting element brings about a greater outflow of heat in the layer sequence via, for example, the substrate. This results in reduced heating of the layer sequence and of the area surrounding it. The connecting element, which causes better removal of heat from the layer sequence, makes it possible to achieve a smaller shift in the color locus and therefore, as a whole, to improve the optical properties of the optoelectronic component. The luminous efficiency can thus be improved.

According to one embodiment, the layer sequence can be a semiconductor layer sequence, wherein the semiconductor materials occurring in the semiconductor layer sequence are not restricted, provided that at least one semiconductor layer having an active region has electroluminescence. By way of example, the semiconductor layer sequence can comprise an individual layer containing compounds composed of elements which are selected from indium, gallium, aluminum, nitrogen, phosphorus, arsenic, oxygen, silicon, carbon and combinations thereof. However, it is also possible to use other elements and additives. The layer sequence having an active region can be based on nitride compound semiconductor materials or InGaAlP compound semiconductor materials, for example. In the present context, "based on nitride compound semiconductor material" means that the semiconductor layer sequence or at least one part thereof comprises or consists of a nitride compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise, for example, one or more dopants and additional constituents. For the sake of simplicity, however, the above formula includes only the essential constituents of the crystal lattice (Al, Ga, In, N), even if these can be replaced and/or supplemented in part by small amounts of further substances.

The semiconductor layer sequence can comprise as active region, for example, a conventional pn junction, a double heterostructure, a single quantum well structure (SQW structure) or a multiple quantum well structure (MQW structure). Besides the active region, the semiconductor layer sequence can comprise further functional layers and functional regions, for instance p- or n-doped charge carrier transport layers, that is to say electron or hole transport layers, p- or n-doped confinement or cladding layers, buffer layers and/or electrodes and combinations thereof. Such structures concerning the active region or the further functional layers and regions are known to the person skilled in the art in particular with regard to construction, function and structure and therefore will not be explained in any greater detail at this juncture.

According to a further embodiment, a semiconductor chip comprises the radiation-emitting or electroluminescent layer sequence.

According to a further embodiment, the semiconductor chip can be a laser diode, a resonant-cavity light-emitting diode or an organic light-emitting diode (OLED).

According to one embodiment, the semiconductor chip has a carrier with a semiconductor material which comprises silicon and the compounds thereof, germanium and the compounds thereof, sapphire and/or gallium arsenide.

According to a further embodiment, the substrate can be a printed circuit board (PCB), a ceramic substrate, a circuit board, an aluminum plate, a copper plate, a plastics injection molding or a stamped circuit board (SCB), glass or a film. The substrate can comprise $Al_2O_3$, AlN, SiC, $Si_3N_4$ or BeO.

According to one embodiment, the connecting element has a parameter which is anisotropic with respect to a direction in space. The parameter can be selected from a group consisting of coefficient of thermal expansion, modulus of elasticity, birefringence, electric constant, permeability, elastic constants, dielectric variables, electrical conductivity and thermal conductivity.

In particular, according to a further embodiment, the connecting material has an anisotropic thermal conductivity. Here and hereinbelow, "thermal conductivity" denotes the ability of at least one substance, for example, of the connecting material, to transport heat or energy. Here and hereinbelow, "anisotropic thermal conductivity" denotes the direction-dependent thermal conductivity of a substance, for example, of the connecting material. In particular, a predominantly perpendicular orientation of the molecule longitudinal axis of the molecules of the connecting material brings about an anisotropic thermal conductivity in a perpendicular direction in relation to the surface of the substrate which faces toward the connecting element. This means that, through the orientation of the molecules of the connecting material, the thermal conductivity is higher in the direction of the surface of the substrate which faces toward and/or in the direction of the surface of the substrate which is remote from the connecting element than parallel to these surfaces of the substrate. As a result, during the operation of an optoelectronic component, the heat generated in the layer sequence can be transported more effectively via the connecting element to the substrate and removed. The orientation of the molecules of the connecting material reduces the heat transfer resistance compared to connecting materials which have an isotropic orientation of the molecules. This leads to reduced heating and to a higher luminous efficiency of the optoelectronic component. "Surface of the substrate which faces toward the connecting element" is to be understood as meaning that surface which is directly or indirectly in direct mechanical and/or electrical contact with the connecting element. "Surface of the substrate which is remote from the connecting element" is to be understood as meaning that surface of the substrate which is parallel to the surface of the substrate which faces toward the connecting element.

According to a further embodiment, the connecting element has an anisotropic thermal conductivity lying in the range of 1 to 37 W/mK. Such a high thermal conductivity of the connecting element according to the invention is based on the oriented molecule configuration of the connecting material. The orientation of the individual molecules of the connecting material among one another, it being possible for these to be arranged, for example, predominantly parallel to one another and/or parallel in relation to the surface of the substrate which faces toward the connecting element, makes it possible on the one hand to increase the thermal conductivity compared to conventional connecting elements, which merely have a relatively low thermal conductivity of, for example, 0.01 to at most 0.4 W/mK. This promotes the dissipation of heat via the connecting element outward in the direction of the surface of the substrate which faces toward and in the direction of the surface of the substrate which is remote from the connecting element. Alternatively, the molecules of the connecting material can be arranged parallel to one another and parallel to the surface of the substrate which faces toward the connecting element. By way of example, the latter can promote the dissipation of heat laterally via the connecting element, for example, outward via a potting.

According to one embodiment, the connecting element has an electrical conductivity. The electrical conductivity can be anisotropic. The electrical conductivity is increased to a particular extent if the molecules of the connecting material predominantly have a parallel orientation among one another and/or a perpendicular orientation in relation to the layer sequence or to the surface of the substrate which faces toward the connecting element. As a result, the connecting element can act as an electrical connection to the substrate. An additional connection between the semiconductor chip and the substrate is not absolutely necessary, and therefore it is possible to save costs and material.

According to one embodiment, the connecting element has a thermal conductivity. A connecting element which is only thermally conductive represents an improvement for an optoelectronic component having two electrodes.

According to a further embodiment, the connecting material is transparent. The transparent connecting element can transmit the electromagnetic radiation emitted by the layer sequence. The transparency can also be anisotropic and can be at a maximum, for example, in a direction perpendicular to the substrate. As a result, the electromagnetic radiation can be reflected on the substrate, with the coupling-out of light being increased. As a result, the advantage of the reflection of the light on the substrate can be utilized.

According to a further embodiment, the connecting material is selected from a group consisting of polymers, block copolymers, graft polymers, dendrimers, graphene and combinations thereof.

Here and hereinbelow, "polymer" denotes a chemical compound of chains or branched molecules which in turn is constructed from the same or similar monomer units. By way of example, polymers can be selected from a group consisting of polyethylene and polypropylene.

A "block copolymer" is a copolymer having linearly linked blocks. "Block" is understood to mean a portion of a polymeric molecule which comprises a plurality of identical repeating monomer units and has at least one constitutional or configurative feature which differs from those of the adjoining blocks. Copolymers are polymers which are composed of two or more different monomer units.

"Graft polymers" or else "graft copolymers" are copolymers in which the blocks of a monomer are grafted onto a backbone of another monomer.

"Dendrimers" are chemical compounds having a ramified structure like a tree proceeding from a branching core, with reference being made here to dendrimers if this ramification consists of repeating monomer units. This gives rise to a radial symmetry.

Here and hereinbelow, "graphene" denotes a modification of carbon having a two-dimensional structure, in which each carbon atom is surrounded by three others, such that a flat, honeycomb-like structure forms. The two-dimensional structure of a first layer can be formed with a two-dimensional structure of a second layer of the graphene, such that stacking of the individual monolayers generates a three-dimensional structure. This three-dimensional structure is referred to as "graphite".

In particular, graphene and another connecting material which is not graphene are mixed. This can increase the thermal conductivity. This results from the spatial arrangement of the graphene and the incorporation thereof in the connecting material. Thus, for example, pi-pi interactions between the graphene and the connecting material can increase the thermal conductivity.

The oriented molecule configuration of the connecting material, for example, of the polymers, block copolymers, graft polymers and dendrimers, can be produced by means of various polymerization methods. Polymerization methods are, for example, anionic copolymerization, cationic copolymerization, graft polymerization, ATRP (Atom Transfer Radical Polymerization), divergent, cationic polymerization, anionic polymerization, radical polymerization or convergent synthesis of dendrimers.

According to a further embodiment, the connecting material is formed as particles and is embedded in a matrix material. The connecting material in the form of particles has an oriented molecule configuration in this case. The matrix material does not have to have any anisotropic properties. The particles have a size of 1 to 5000 nm, preferably 1 to 200 nm, particularly preferably a size of smaller than 100 nm, for example, 80 nm. The size of the particles makes it possible to preserve the transparency of the connecting element and at the same time to increase the thermal conductivity. The transparency can furthermore be set to a certain value. In particular, the electromagnetic radiation, for example, the electromagnetic radiation emitted by an optoelectronic component, is not scattered by particles having a size of smaller than or equal to 100 nm, and as a result the transparency of the connecting element is retained. "Transparency" means that there is a transmission of greater than or equal to 70%, in particular greater than or equal to 80%, for example, 85%, at an appropriate wavelength of the electromagnetic radiation. The connecting materials described here in the description, for example, polymers, block copolymers and graft polymers, are used as a connecting material in the form of particles. In particular, however, it is also possible to use individual fragments of these connecting materials as particles. In this context, fragments are, for example, monomer units, which are a constituent of the polymers, block copolymers and/or graft polymers.

Here and hereinbelow, "matrix material" denotes materials which are used for conventional connecting elements. Matrix materials can comprise silicone-based, epoxy-based and/or hybrid-based materials. In contrast to the connecting material, the matrix material does not have any oriented molecules. The thermal conductivity of the matrix material is isotropic. In particular, the matrix material can be silicone, a methyl-substituted silicone, for example, poly(dimethylsiloxane) and/or polymethylphenylsiloxane, a cyclohexyl-substituted silicone, for example, poly(dicyclohexyl)siloxane, or a combination thereof. The connecting material formed as particles can be embedded in the matrix material. The particles can be distributed homogeneously in the matrix material. It is also conceivable that the particles are distributed with a concentration gradient in the matrix material. In this case, it is possible to generate anisotropic properties in the matrix by means of a suitably selected particle distribution in the matrix material. A partial anisotropic thermal conductivity can be generated in the isotropic matrix material by embedding a connecting material formed as particles and having an oriented molecule configuration. This brings about a direction-dependent thermal conductivity in the region of the particles compared to the direction-independent thermal conductivity of the matrix material. As a result, the heat which arises in the connecting element can be removed in a targeted manner, for example, in the direction of the substrate and/or housing. By increasing or reducing the proportion of the connecting material in the matrix material, it is possible to set a desired value for the thermal conductivity and/or to control the thermal conductivity in terms of process engineering.

According to a further embodiment, the connecting element is formed as a layer and/or film. The connecting element, which is formed as a layer and/or film and comprises the connecting material having an oriented molecule configuration, can have a homogeneous distribution of the connecting material having an oriented molecule configuration. It is thereby possible to generate a uniform anisotropic thermal conductivity of the connecting element, for example, over the entire surface of the substrate or an entire surface of the layer sequence which faces toward the connecting element. This leads to a uniform dissipation of heat from the layer sequence through the connecting element. As a result, the layer sequence can be energized to a greater extent, resulting in a higher efficiency of the optoelectronic component.

According to a further embodiment, the size of the particles can at least correspond to the thickness of the layer and/or film of the connecting element. It is thereby possible to induce self-orientation of the molecules of the connecting material during production. In this context, "self-orientation" means that the molecules of the connecting material are configured by the application of the layer sequence. In this context, "configurate" denotes the generation of an oriented molecule configuration in the connecting element.

According to a further embodiment, the connecting material is crystalline and/or amorphous. Here and hereinbelow, "crystalline" means that the connecting material has both a short-range order and a long-range order in the arrangements of the atoms. Here and hereinbelow, "amorphous" means that the connecting element can have a short-range order, but no long-range order. The short-range order of an amorphous connecting material usually corresponds to the structure of the corresponding crystalline connecting material. A crystalline connecting material can comprise polyethylene glycol (PEO) and/or also other polymer blocks, such as poly(tert-butyl acrylate). Crystalline connecting material can be selected from a group consisting of polystyrene-b-polyethylene glycol (PS-b-PEO), polystyrene-b-polybutadiene (PS-b-PBD), polystyrene-b-polybutadiene-b-poly(tert-butyl acrylate) (PS-b-PBD-b-PtBA) or polystyrene-b-polybutadiene-b-polymethyl methacrylate (PS-b-PBD-b-PMMA) and the combinations thereof. In all of these embodiments, the blocks are linked to one another directly or by a constitutional unit b. Dendrimers and the combinations thereof can comprise polyethylene glycol side chains or liquid crystalline side chains in a crystalline connecting material.

Here and hereinbelow, "liquid crystalline" denotes a property of a chemical substance, the chemical substance comprising or consisting of monomers, oligomers or polymers, for example. The chemical substance can exhibit both properties of a crystal, for example, the directional dependency of physical properties (anisotropy), and properties of a liquid, for example, electrical and optical properties or flow behavior, with both phases (liquid and crystalline) being present alongside one another (mesophases) in a certain temperature range.

According to one embodiment, the connecting element can comprise a crystalline connecting material, the connecting element having a high anisotropic thermal conductivity lying in the order of magnitude of greater than or equal to 37 W/mK. As an alternative or in addition, a connecting element formed as a layer can have an anisotropic thermal conductivity of greater than or equal to 37 W/mK. Crystalline connecting materials by nature already have anisotropy. This results from the crystalline structure of the connecting material in the form of a lattice and as a result of the fact that the arrangement of the crystalline building blocks in a crystal is different along the three main axes of the lattice (x, y and z direction). As a result, the crystalline connecting material can have a particularly high anisotropic thermal conductivity, which cannot be generated in the case of connecting materials having an isotropic thermal conductivity. Amorphous connecting materials, which by nature are isotropic, can be made artificially anisotropic by an external influence, for example, by pressure, electric fields, the action of force. As a result, an inherently isotropic, amorphous connecting material can be provided with an anisotropic thermal conductivity.

What is furthermore specified is a method for producing an optoelectronic component, said method comprising the following method steps: A) providing a substrate, and B) applying the connecting element to the substrate. The connecting element comprises at least one connecting material, which has an oriented molecule configuration, or wherein the oriented molecule configuration of the connecting material is produced in or after method step B).

In this case, all embodiments and definitions of an optoelectronic component which have been explained to date in the description of the general part apply to the method for producing an optoelectronic component. This applies in particular to the embodiments of the layer sequence, of the substrate or of the connecting element.

According to a further embodiment, the oriented molecule configuration of the connecting material is produced by thermal treatment, the application of an electric field, treatment with pressure and/or the action of a force.

According to a further embodiment, method step A) additionally comprises a method step A'):

A') heating the substrate, such that an oriented molecule configuration of the connecting material is produced in method step B) during the application of the connecting element to the substrate.

According to a further embodiment, an additional method step C) is carried out after method step B):

C) applying a layer sequence to the connecting element such that an oriented molecule configuration of the connecting material is simultaneously produced in the connecting element during the application of the layer sequence.

According to one embodiment, the semiconductor chip can be present in the form of a bare, i.e., unpackaged, semiconductor chip, also referred to as an LED or as a "die". The at least one unpackaged semiconductor chip can be placed onto the connecting element and substrate, for example, a circuit board, and the electrical contacts of the unpackaged semiconductor chip can be connected to the pads of the circuit board by means of wire bonding using gold wires in the micrometer range (what is termed die bonding). It is thereby possible to ensure a virtually limitless freedom of design for the substrate, for example, for the circuit boards, and to thus produce individual optoelectronic components.

BRIEF DESCRIPTION OF THE DRAWINGS

Hereinbelow, further advantages and also advantageous embodiments and developments of the subject matter according to the invention will be explained in more detail on the basis of figures and exemplary embodiments.

In the figures:

FIG. 6 shows a method for producing an optoelectronic component according to a further embodiment; and FIG. 7 shows a method for producing an optoelectronic component according to a further embodiment.

In the exemplary embodiments and figures, component parts which are identical or act identically are provided in each case with the same reference signs. The elements shown and the size relationships thereof among one another are fundamentally not to be regarded as true to scale.

DETAILED DESCRIPTION OF ILLUSTRATIVE EMBODIMENTS

Figure 1:
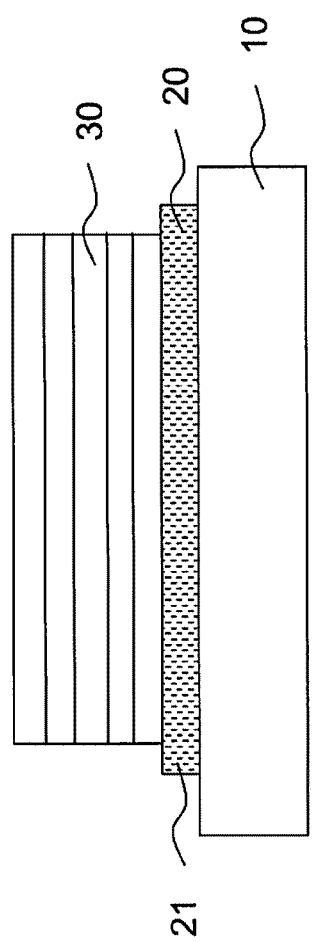
FIG. 1 schematically shows an optoelectronic component according to one embodiment.

FIG. 1 shows a schematic side view of an optoelectronic component. The optoelectronic component has a substrate 10, a connecting element 20, which is arranged above the substrate 10, and a layer sequence 30. The connecting element 20 is therefore arranged between the substrate 10 and the layer sequence 30. The connecting element 20 comprises a connecting material having an oriented molecule configuration 21. The connecting element 20 can be transparent. By way of example, the molecules of the connecting material can be arranged predominantly parallel to one another and/or perpendicular to the surface of the substrate which faces toward and/or to the surface of the substrate which is remote from the connecting element. A deviation from this molecule orientation is likewise possible.

The connecting element 20 can be formed as a layer and/or film. The molecules of the connecting material in the connecting element can be oriented or pre-oriented by nature. In this context, "oriented by nature" means that the connecting element 20 has oriented molecules without additional treatment, for example, by the action of force, pressure, temperature, etc. The orientation of the molecules of the connecting material 21 produces an anisotropic thermal conductivity in the connecting element. This results in a better dissipation of heat which arises, for example, in the layer sequence. Overheating of the layer sequence can be avoided, with greater energization of the optoelectronic component being possible. This can lead to a higher luminous efficiency of the optoelectronic component.

As an alternative or in addition, it is possible to generate a roughness of the surface of the connecting element, for example, of less than 1 μm, thin layers, for example, having a layer thickness of less than 1 μm. In this context, "roughness" denotes the unevenness of the surface height of the connecting element. This leads to a reduction in the thermal resistance of the connecting element and therefore to a better dissipation of heat which arises.

Alternatively, it is possible that the connecting element 20 connects the substrate 10 and the layer sequence 30 selectively (not shown here). Here and hereinbelow, "selectively" means that the connecting element 20 does not form a homogeneous layer. The connecting element 20 can consist of a plurality of individual regions which are not connected to one another, the individual regions fixing the substrate 10 on the layer sequence 30 or vice versa. It is thereby possible to save connecting material and costs. At the same time, adequate fixing of the substrate 10 on the layer sequence 30, or vice versa, is ensured, with an adequate dissipation of heat via the connecting element 20 being possible.

The active region is suitable for the emission of electromagnetic radiation in an emission direction. The layer sequence 30 having an active region can be based, for example, on nitride compound semiconductor material. Nitride compound semiconductor material emits, in particular, electromagnetic primary radiation in the blue and/or ultraviolet range.

Figure 2:
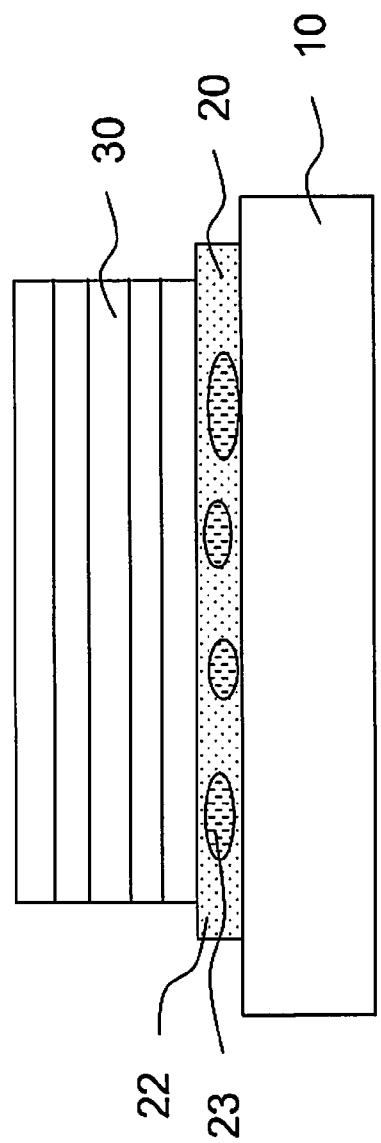
FIG. 2 schematically shows an optoelectronic component according to a further embodiment.

FIG. 2 shows the schematic side view of an optoelectronic component. In FIG. 2, the structure of the optoelectronic component is analogous to FIG. 1, with the connecting elements 20 in FIGS. 1 and 2 being different. The connecting element 20 shown in FIG. 2 can be transparent. The connecting element 20 in FIG. 2 comprises a connecting material, which is embedded in a matrix material 22. The matrix material 22 has isotropic properties or parameters. The matrix material 22 can be a conventional matrix material, for example, a silicone-based, epoxy-based or hybrid-based material. The connecting material 23, which can be configured as particles, has anisotropic properties or parameters. A partial anisotropic parameter, for example, a partial anisotropic thermal conductivity, can be produced by embedding the particles of the connecting material 23 in a conventional matrix material 22. The connecting element 20 can be a partially oriented layer. It is thereby possible to produce an increased thermal conductivity of the connecting element 20 in the direction of the substrate 10 compared to a connecting element comprising merely an isotropic matrix material. The orientation of the molecules of the connecting material can be analogous to the orientation described in FIG. 1. The orientation of the molecules of the connecting material can be generated, for example, by the production method. If the diameter of the particles of the connecting material 23 is greater than the thickness of the layer and/or film, the molecules of the connecting material can orient themselves. The molecules can then assume an intermediate position between the parallel and perpendicular orientation in relation to the surface of the substrate which faces toward the connecting element. If the diameter of the particles of the connecting material is the same as the thickness of the layer and/or film, the molecules of the connecting material can orient themselves, with a predominantly perpendicular orientation of the molecules in relation to the surface of the substrate being possible.

The thermal conductivity of the connecting material can be set and controlled by varying the degree of filling of the connecting material in the matrix material 22. The transparency of the connecting element 20 can be retained in spite of a high degree of filling of the connecting material in the matrix material 22.

Figure 3:
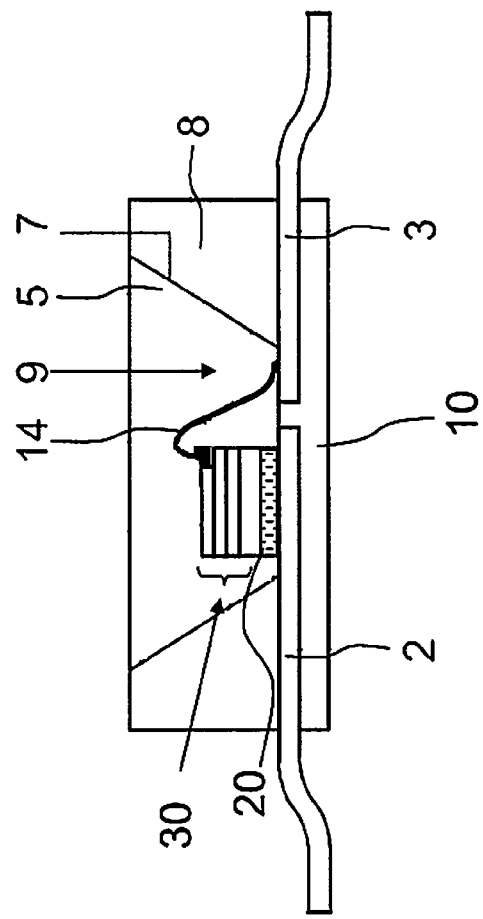
FIG. 3 schematically shows an optoelectronic component according to one embodiment.

FIG. 3 shows the schematic side view of an optoelectronic component. The optoelectronic component has a connecting element 20 between a layer sequence 30 having an active region (not explicitly shown) and a substrate 10, a first electrical connection 2, a second electrical connection 3, a bonding wire 14, a potting 5, a housing wall 7, a housing 8 and a recess 9. The connecting element can be formed as described in FIG. 1 or 2.

In the potting 5, converter materials can be embedded in a material, for example. Alternatively, it is possible for converter material to be arranged indirectly or directly on the housing wall 7 of a housing of an optoelectronic component (not shown here). Converter material can convert the electromagnetic radiation emitted by the layer sequence into an electromagnetic radiation having a different wavelength or a different wavelength range, usually having a greater wavelength.

Figure 4:
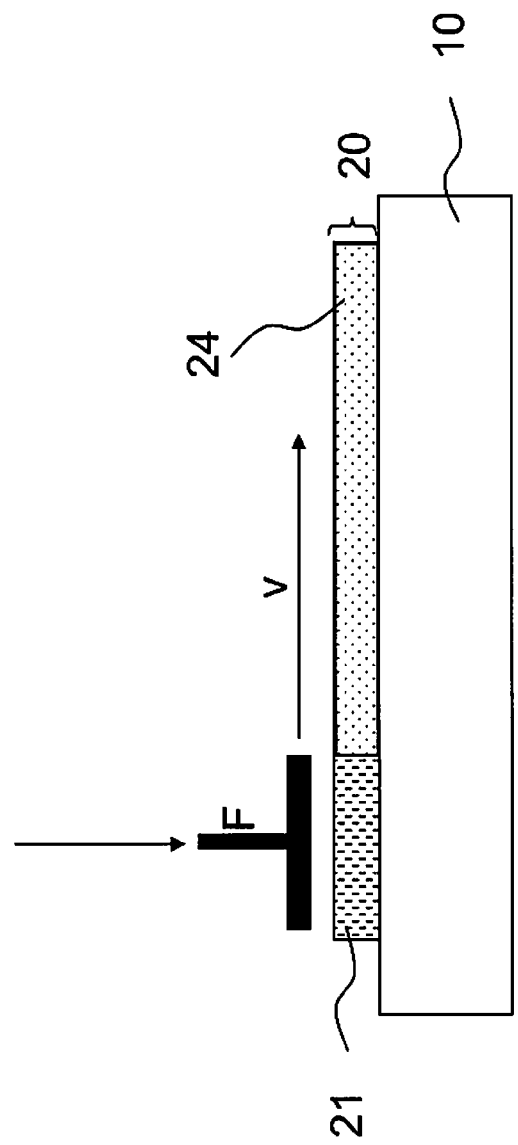
FIG. 4 shows a method for producing a connecting element according to one embodiment.

FIG. 4 shows a method for producing a connecting element according to the invention. Provision can be made of a substrate, to which a connecting element 20 is applied. The connecting element 20 can comprise an initial connecting material having isotropic properties or parameters 24. By exerting a force F, for example, by means of a stamp and/or a block, onto the surface of the connecting element which faces toward the stamp, it is possible for the molecules of the connecting material to be oriented 21, with anisotropic properties or parameters being produced. In addition or as an alternative, the substrate 10 can be heated. A stamp and/or block can be moved over the connecting element 20 at a velocity v and produce a connecting element 20 comprising a connecting material having anisotropic parameters. The stamp and/or block is firstly wetted with material, then pressed on and moved horizontally.

Figure 5:
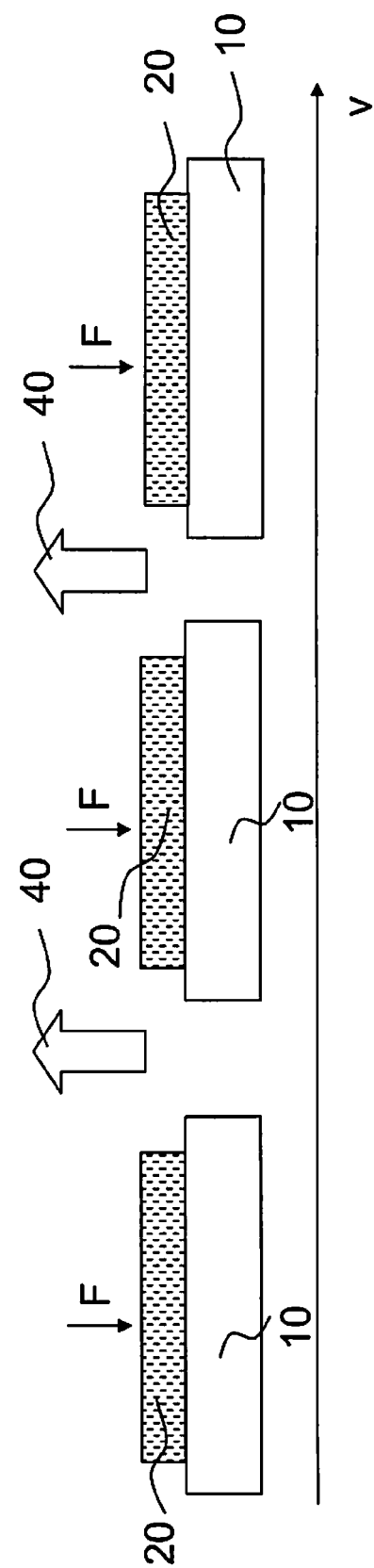
FIG. 5 shows a method for producing an optoelectronic component according to one embodiment.

FIG. 5 shows a method for the simultaneous or successive production of at least two optoelectronic components which comprise the connecting element 20. This differs from FIG. 4 in that a plurality of optoelectronic components each comprising at least one connecting element with an unoriented molecule configuration are arranged on the substrate 10 at the same time. These optoelectronic components can be arranged on a kind of conveyor belt or assembly line, for example, it being possible for the conveyor belt or assembly line and the optoelectronic components to move at a velocity v in the horizontal direction. Alternatively, it is possible that no assembly line or conveyor belt may be present or that the latter does not move and has a velocity v=0 m/s. A stamp and/or block, which carries out a downward and upward movement, can be arranged above the optoelectronic components spatially at a distance therefrom. This stamp and/or block can be mounted at a fixed position above the component, so that it cannot move horizontally. Alternatively, it is possible for the stamp to move in the horizontal direction. According to one embodiment, the stamp and/or block can move horizontally and vertically.

In a first possibility for production, the stamp and/or block is at a fixed position above the optoelectronic components and can move only in the vertical direction. The optoelectronic components comprising the respective connecting elements 20 move at a velocity v in the horizontal direction, with the molecules of the connecting material being oriented by the downward movement of the stamp and/or block. The connecting elements 20 are thus produced in succession.

In a second possibility for production, the stamp and/or block is at a variable position in the horizontal and vertical directions. The optoelectronic components comprising the respective connecting elements 20 can have a velocity v=0 m/s during the movement of the stamp and thus do not move during this production step. The movably arranged stamp and/or block can therefore orient the molecules of the connecting material in succession by the downward movement of the stamp and/or block.

Alternatively, both the stamp and the conveyor belt can move. The direction of relative movement between the stamp and the conveyor belt can be in the same horizontal direction or in opposite directions.

Alternatively, it is also possible to use a plurality of stamps and/or blocks. It is thereby possible to quickly produce a large number of connecting elements 20 at the same time. This saves time and costs.

By way of example, at least one stamp can be arranged above each optoelectronic component.

During the downward movement of the stamp and/or block, the spatial distance between at least the top surface of the connecting element and a bottom surface of the stamp and/or block becomes increasingly smaller, until these are in direct contact with one another. A force is thereby exerted on the connecting element 20, in which case the unoriented molecules can be oriented. This is followed by the upward movement 40 of the stamp and/or block, with the stamp and/or block moving away from the connecting element. In the following method step, the layer sequence 30 can be applied (FIG. 6).

FIG. 7 shows a method for producing at least one optoelectronic component. The connecting element 20 here is formed as an adhesive film or adhesive foil and already comprises by nature a connecting material having a pre-oriented molecule configuration 25. "Pre-oriented" means that the molecules of the connecting material are not yet in their final orientation formed in equilibrium. Provision is made of a substrate 10, which can be heated or unheated. A connecting element 20 is placed with a force on this substrate 10 in what is termed a "pick and place process" on the substrate (step D). As a result, the pre-oriented molecules can be oriented. As an alternative or in addition, the molecules of the connecting material can be oriented by increasing and/or lowering the temperature, for example, by heating or cooling the substrate, or over time. Then, the layer sequence 30 can be applied (step E). Alternatively, steps D and E can be effected at the same time, such that an orientation can be produced in the connecting element 20 by applying the layer sequence 30 (step G). In particular, the adhesive film can have a thin layer thickness, preferably a layer thickness of 10 to 50 µm, for example, 30 µm. The advantage of these thin adhesive films is that no adhesive fillet arises. This saves at least one further process step for removing the latter and therefore costs. Here, "adhesive fillet" denotes the connecting material on the side face of the optoelectronic component and not underneath the optoelectronic component.

The invention is not restricted by the description on the basis of the exemplary embodiments. Instead, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic component comprising:
   a substrate;
   a connecting element disposed on the substrate; and
   a layer sequence disposed on the connecting element, the layer sequence configured to emit electromagnetic radiation,
   wherein the connecting element comprises a connecting material,
   wherein the connecting material has an pre-oriented molecule configuration,
   wherein the connecting element has at least one parameter which is anisotropic,
   wherein the connecting element connects the substrate to the layer sequence,
   wherein the connecting material comprises a material selected from the group consisting of polymers, block copolymers, graft polymers, dendrimers and combinations thereof,
   wherein more than 80% of molecule longitudinal axes of individual molecules of the connecting material have a predominantly perpendicular orientation to a surface of the substrate,
   wherein the connecting material has properties so that it is pre-oriented before application and requires no additional treatment for orientation after application,
   wherein the connecting element is an adhesive film or adhesive foil, and
   wherein, in the pre-oriented molecule configuration, the connecting element has an anisotropic thermal conductivity in a direction perpendicular to the surface of the substrate.

2. The optoelectronic component according to claim 1, wherein the connecting element is transparent.

3. The optoelectronic component according to claim 1, wherein the connecting material comprises a combination of graphene with polymers, block copolymers, graft polymers or dendrimers.

4. The optoelectronic component according to claim 1, wherein the connecting material is formed as particles and is embedded in a matrix material.

5. The optoelectronic component according to claim 1, wherein the connecting element is formed as a layer.

6. The optoelectronic component according to claim 1, wherein individual molecules of the connecting material are arranged predominantly parallel to one another among one another.

7. The optoelectronic component according to claim 1, wherein individual molecules of the connecting material are arranged predominantly parallel and/or perpendicular to the surface of the substrate which faces toward the connecting element.

8. The optoelectronic component according to claim 1, wherein the connecting element is formed as a film.

9. The optoelectronic component according to claim 1, wherein the connecting material is crystalline.

10. The optoelectronic component according to claim 1, wherein the connecting material is amorphous.

11. The optoelectronic component according to claim 1, wherein the connecting element comprises a crystalline connecting material, and wherein the connecting element has a thermal conductivity of greater than or equal to 37 W/mk.

12. A method for producing an optoelectronic component, the method comprising:
   providing a substrate;
   forming a connecting element on the substrate; and
   applying a layer sequence on the connecting element, the layer sequence configured to emit electromagnetic radiation,
   wherein the connecting element comprises at least one connecting material,
   wherein the connecting material has a permanent pre-oriented molecule configuration,
   wherein the connecting element has at least one parameter which is anisotropic,
   wherein the connecting element connect connects the substrate to the layer sequence,
   wherein the connecting material comprises a material selected from the group consisting of polymers, block copolymers, graft polymers, dendrimers and combinations thereof,
   wherein more than 80% of molecule longitudinal axes of individual molecules of the connecting material have a predominantly perpendicular orientation to a surface of the substrate,
   wherein the connecting element is an adhesive film or adhesive foil, the connecting material having the permanent pre-oriented molecule configuration so that the connecting element is pre-oriented before forming the connecting element and no additional treatment for orientation is performed after forming the connecting element, and
   wherein, in the permanent pre-oriented molecule configuration, the connecting element has an anisotropic thermal conductivity in a direction perpendicular to the surface of the substrate.

13. The method according to claim 12, wherein the oriented molecule configuration of the connecting material is produced by thermal treatment, application of an electric field, treatment with pressure or an action of a force.

14. The method according to claim 12, further comprising, heating the substrate, such that an oriented molecule configuration of the connecting material is produced during the forming of the connecting element to the substrate.

15. A method for producing an optoelectronic component, the method comprising:
   providing a substrate;
   applying an adhesive film or adhesive foil connecting element to the substrate, the connecting element comprising a connecting material selected from the group consisting of polymers, block copolymers, graft polymers, dendrimers and combinations thereof, the connecting material having a permanent pre-oriented molecule configuration so that the connecting element is pre-oriented before applying the connecting element and no additional treatment for orientation is performed after applying the connecting element, wherein more than 80% of molecule longitudinal axes of individual molecules of the connecting material have a predominantly perpendicular orientation to a surface of the substrate, and wherein, in the permanent pre-oriented molecule configuration, the connecting element has an anisotropic thermal conductivity in a direction perpendicular to the surface of the substrate; and forming a layer sequence on the connecting element, the layer sequence configured to emit electromagnetic radiation, wherein the connecting element is transparent and comprises the connecting material embedded in a matrix material, wherein the matrix material is isotropic, wherein the connecting material comprises particles that have the anisotropic thermal conductivity such that the connecting element is a partially oriented film or foil, and wherein a diameter of the particles of the connecting material is greater than a thickness of the film or foil.

16. The method according to claim 15, wherein the pre-oriented molecule configuration of the connecting material is produced by thermal treatment, application of an electric field, treatment with pressure or an action of a force.

17. The method according to claim 15, further comprising heating the substrate, such that the pre-oriented molecule configuration of the connecting material is produced while applying the connecting element to the substrate.

18. The method according to claim 15, wherein the connecting comprises a combination of graphene with polymers, block copolymers, graft polymers or dendrimers.

19. The method according to claim 15, wherein the connecting element has a thermal conductivity of greater than or equal to 37 W/mk.

* * * * *